United States Patent [19]

Iyengar

[11] 4,310,474
[45] Jan. 12, 1982

[54] METHOD AND APPARATUS FOR GENERATING A VAPOR STREAM

[75] Inventor: Rama Iyengar, Gwinnett, Ga.

[73] Assignee: Western Electric Company, Inc., New York, N.Y.

[21] Appl. No.: 136,597

[22] Filed: Apr. 2, 1980

[51] Int. Cl.³ .............................................. B05B 5/02
[52] U.S. Cl. ........................................ 261/1; 261/118;
    261/DIG. 65; 128/204.21; 128/200.16;
    123/537; 239/3; 239/102; 239/693; 239/697;
    239/704; 361/228
[58] Field of Search ................... 261/DIG. 80, 1, 115,
    261/118, DIG. 65; 239/3, 4, 102, 121, 690, 693,
    697, 704; 128/204.21, 202.25, 200.16, 203.16;
    361/226, 228; 123/119 EE

[56] References Cited

U.S. PATENT DOCUMENTS

| | | | |
|---|---|---|---|
| 3,266,783 | 8/1966 | Knight | 261/1 |
| 3,281,860 | 10/1966 | Adams et al. | 239/4 |
| 3,537,829 | 11/1970 | Ott | 261/1 |
| 3,570,275 | 3/1971 | Weber et al. | 239/4 |
| 3,761,941 | 9/1973 | Robertson | 239/690 |
| 3,769,624 | 10/1973 | Lee et al. | 361/228 |
| 3,769,625 | 10/1973 | Gunn | 361/228 |
| 3,769,627 | 10/1973 | Stone | 361/228 |
| 4,184,169 | 1/1980 | Vandervalk | 346/75 |

FOREIGN PATENT DOCUMENTS 596782  2/1978  U.S.S.R. ................ 261/DIG. 80

Primary Examiner—Gregory N. Clements
Attorney, Agent, or Firm—Robert B. Kennedy

[57] ABSTRACT

A method of generating a vapor stream is disclosed which comprises the steps of providing a jet of electrostatically chargeable liquid particles and electrostatically controlling the jet so as to meter some of the liquid particles into a vaporizer for a period of time sufficient to become vaporized.

13 Claims, 1 Drawing Figure

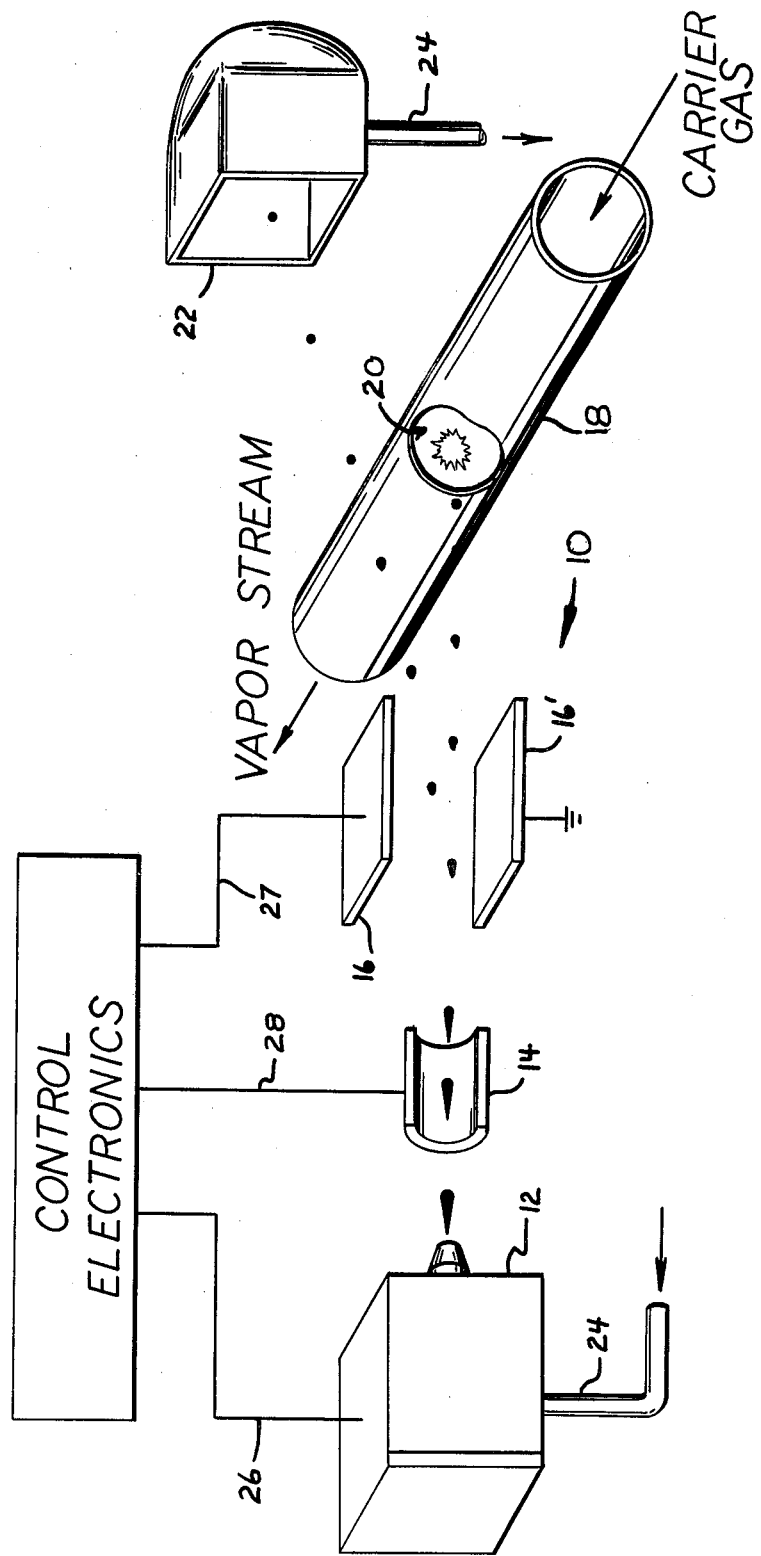

METHOD AND APPARATUS FOR GENERATING A VAPOR STREAM

TECHNICAL FIELD

This invention relates to methods and apparatuses for generating vapor streams.

BACKGROUND OF THE INVENTION

Vapor streams are today generated and utilized in a number of industrial applications. For example, in constructing preforms from which optical fibers may be drawn, vapors of materials such as $SiCl_4$, $GeCl_4$, $POCl_3$ and $BBr_3$ are generated and delivered to a preform construction site where they are reacted and deposited in or on a support. This is typically done by passing carrier gases such as $H_2$, $He$, $N_2$, $O_2$ or $Ar$ through a supply of the material in liquid form and to the deposition site with vapors of the material entrained with the carrier gas. In performing this operation a vaporizer is ordinarily used of the type known as a bubbler which has a carrier gas intake conduit that terminates with an outlet orifice located below the surface of the liquid materials, and an outlet conduit extending from the space above the surface of the liquid within the bubbler to the vapor deposition site.

Vapor streams are also generated and utilized in internal combustion engines such as those used in powering motor vehicles. In this application a vapor stream is ordinarily created either by the use of carburetion of fuel injection systems. Where a carburetor is used an airstream is drawn through a carburetor throat into which airstream liquid fuel is drawn by venturi action. From here the airstream is drawn into the intake manifold of the engine along with the fuel in vapor as well as in aerosol and droplet form. With fuel injection type systems electronically controlled injectors are used to inject droplets of the fuel directly into the airstream just upstream of the engine intake manifold.

A long term problem and limitation commonly associated with the just described methods of generating vapor streams has been that of accurately and rapidly controlling the mass flow rate of the vapor present within the vapor stream. For example, to construct an optical fiber waveguide preform properly, the mass flow rate of the vapor must be carefully programmed and accurately controlled. Heretofore, control has typically been achieved with the use of controllers of the type that employs a carrier gas mass flow rate sensor and a vapor to carrier gas ratio sensor. The carrier gas flow rate sensor operates on the theory that the heat added to a known mass of gas is proportional to its temperature rise at relatively constant pressure. They typically employ two resistance heating elements which are part of a bridge circuit positioned in series with each other on the outside of a sensor tube. Gases are passed through the sensor tube which creates a bridging balance, the signal from which is proportional to the mass flow rate. The vapor to carrier gas ratio sensor also operates as a function of heat transfer. This sensor employs one electrical resistance element located in the carrier gas intake stream and another in the vapor and carrier gas stream, hereinafter termed "vapor stream". Again, the sensors are elements of a bridge circuit which indicates any imbalance as soon as the properties of the gas and vapor stream differ. This difference is proportional to the ratio of source to carrier gas.

This just described control system is quite inaccurate with deviations from optimum set points ranging as great as 30% over both long and short terms. This is attributable at least in part to the fact that this method assumes a steady state condition of vapor pressure. In actuality though bubbler type vapor generation systems are not in steady state since mass flow rate depends on numerous criteria such as carrier gas retention time within the liquid, the depth at which the bubbles are released within the liquid, the size of bubbles, total pressure, carrier gas temperature, local temperature inhomogenetities surrounding the bubbles as they travel towards the liquid surface, and heat flow into the bubbler from its environment. These effects all become more important as flow rates increase and the liquid level in the bubbler decreases since retention by carrier gases also decreases as localized cooling takes place.

Vapor delivery rate control is also important in internal combustion type engines. Today, mechanical or electromechanical systems are used in metering combustible fuels into airstreams that are subsequently fed into engine intake manifolds. Being mechanical, their response times are inherently limited. For example, with conventional carburetors an air-fuel mixture ratio is typically controlled by throttling a butterfly type valve in the carburetor throat downstream of the point at which fuel is drawn by venturi action into the airstream. In these systems there is an inherent slowness in response time during the period between which the butterfly valve position is altered and the rate at which fuel is drawn into the airstream is altered. Even where fuel injection systems are used and electronic control enhances response time and mixture regulation, a mechanical device remains the direct operative means employed in actually metering fuel into the airstream.

As a result of these limitations, it is almost inevitable that compromises be made in internal combustion engine design. It would be more efficient to meter varying air-fuel mixture ratios into the engine combustion chambers at different times within the suction phase of the piston stroke. For example, attempts have been made to introduce a relatively lean combustible mixture into each cylinder barrel during the early portion of the suction stroke and a relatively rich mixture during a later portion to enhance burn efficiency with more of a richer mixture being in the vicinity of spark ignition. Heretofore, vapor delivery response times have simply been far too slow to be capable of performing this and little progress made to date at achieving such mixture stratification.

It thus is seen that there remains a need to provide methods and apparatuses for generating vapor streams with enhanced control speed and accuracy in diverse fields of technology. Accordingly, it is to this general problem to which the present invention is primarily directed.

SUMMARY OF THE INVENTION

In one form of the invention a method is provided for generating a vapor stream which comprises the steps of providing a jet of electrostatically chargeable liquid particles and electrostatically controlling the jet so as to meter some of the liquid particles into a vaporizer for a period of time sufficient to become vaporized.

In another form of the invention a method is provided for generating a vapor stream which comprises the steps of providing a carrier gas stream, providing a stream of electrostatically chargeable particles, and electrostatically controlling the stream of liquid particles so as to maintain some of the particles within the carrier gas stream for a period of time sufficient to become vaporized.

In another form of the invention a method is provided for generating a vapor stream which comprises the steps of providing a carrier gas stream, providing a stream of electrostatically chargeable liquid droplets vaporizable within the carrier gas stream within a period of time, and electrostatically controlling the stream of droplets so as to cause only some of the droplets in the stream of droplets to be in the carrier gas stream for said period of time and thereby become vaporized.

In yet another form of the invention apparatus is provided for generating a vapor stream which comprises means for conveying a carrier gas stream, means for generating a jet of electrostatically chargeable liquid droplets, and means for electrostatically controlling the jet of liquid droplets so as to cause a portion thereof to be in the carrier gas stream for a period of time sufficient to become vaporized.

BRIEF DESCRIPTION OF THE DRAWING

The drawing is a schematic diagram of apparatus for generating a vapor stream in accordance with the invention which apparatus may be used in practicing methods of the invention.

DETAILED DESCRIPTION

Referring now in more detail to the drawing, there is schematically illustrated apparatus for generating a vapor stream which includes a conventional non-impact ink jet generator generally designated at 10. The jet generator includes an ultrasonic drop generator 12, a charge tunnel 14, and a pair of deflection plates 16 and 16', such as those sold by the A. B. Dick Company of Elkgrove, Ill., as their Part Nos. 339000-11, 339015 and 331312, respectively. For a detailed explanation of the generator and its operation reference may be made to the article by Kuhn and Myers titled "Ink-Jet Printing" in the April 1979 issue of Scientific American.

The ultrasonic drop generator, charge tunnel, and the deflection plate 16 are each electrically coupled with control electronics while the deflection plate 16' is electrically grounded. The jet generator is seen to be positioned adjacent a conduit 18 having an aperture 20 formed in its side facing the jet generator. A funnel 22 is located behind and slightly above the conduit and aperture. A drain tube 24 depends downwardly from the funnel and back to the ultrasonic drop generator 12 through unshown pump means. The jet generator 10 is housed within an enclosure through which conduit 18 extends.

In operation the just described apparatus may be used in generating a vapor stream to be conveyed to an optical fiber preform construction site. In this application the ultrasonic drop generator 12, rather than being filled with ink as it would be where used as a printer, is instead filled with dielectric liquid such as $SiCl_4$, $GeCl_4$, $POCl_3$ or $BBr_3$. Preferably, the dielectric liquid has a viscosity of less than 100 cps for efficient drop generation. For the internal combustion engine application previously described a liquid fuel such as gasoline, ethyl alcohol or methyl alcohol is instead supplied to the ultrasonic drop generator. A carrier gas, such as oxygen, helium or argon having a liquefaction temperature substantially lower than the boiling temperature of the dielectric liquid is then drawn through the conduit 18 for preform construction. With the engine application air, comprised of oxygen and nitrogen, is instead drawn through the conduit. Since the jet generator is enclosed in a dead space about the aperture 12 the dead space itself will also be filled with the carrier gas. A stream or jet of droplets is then generated and propelled towards the aperture 20 from the ultrasonic drop generator 12 at a selected, preferably constant rate, by a control signal transmitted over line 26 between the control electronics and the drop generator. A constant electrostatic potential is established across plates 16 and 16' by means of line 27. Digital signals are generated by the control electronics and applied to the charge tunnel 14 over line 28. Since only some of the droplets become charged, only some are deflected as they pass through the electrostatic field between the deflection plates 16 and 16'. In this manner only portions of the jet or train of droplets emitted by the ultrasonic drop generator are introduced into conduit 18 through aperture 20 where they vaporize. Intermittently with this recurrent action other portions of the jet are deflected by the charge plates 16 and 16' over the conduit and into the funnel 22. These droplets then gravitate downwardly and into conduit 24 to be pumped back to the drop generator 12.

The ratio of vapor to carrier gas may be monitored downstream within conduit 18 so that deviations from a desired ratio may be corrected by the control electronics. For example, should a sensed ratio of vapor to carrier gas required to deliver a desired vapor mass flow rate to an optical fiber preform construction site at a given carrier gas flow rate deviate from that ratio desired, a correction signal may be fed back to the control electronics. Through conventional control circuitry the control electronics then adjusts the digital signal applied to the charge tunnel whereupon a greater or lesser portion of the jet is then injected into the carrier gas stream. In the engine application such control signals would ordinarily be generated in response to throttle and engine cycle changes. A typical flow rate for constructing a preform would be one liter of carrier gas per minute into which 400 milligrams of droplets are injected per minute and 400 milligrams of droplets recirculated per minute. With the engine fuel application some 145 grams of fuel may be injected per minute into an airstream flowing at a rate of some 2180 grams per minute.

Since the dead space about aperture 20 is filled with the carrier gas, at startup some portion of the droplets may vaporize within the dead space. However, as this space becomes more saturated most of the jet will then pass through the dead space and enter the conduit with little loss due to transit vaporization. In any event system stabilization is rapidly achieved.

The apparatus just described may readily assume other forms. For example, rather than have a signal applied to the charge tunnel, a constant DC charge may be placed thereon to charge all of the liquid particles passing therethrough. In this case a signal, digital or analog, is applied to the plate 16 to effect deflection of selected portions of the stream of droplets passing therethrough. Then too, the conduit aperture 20 may be located either within the flight path of the charged or the uncharged particles, or within the path of those charged particles which have or have not been deflected. That the collected droplets within the funnel 22 are recirculated is, of course, also optional.

A further modification is to place the jet generator actually within the conduit 18 so as to maintain one stream of droplets within the carrier gas stream for a sufficient time in which to be vaporized while directing other droplets within the jet out of the carrier gas stream as through an aperture in a conduit side before they have had sufficient time in which to become vaporized. In the embodiment illustrated, however, the droplets are shown to vaporize after passing through aperture 20 before striking the opposite wall of conduit 18. The time of transit across the inside of the conduit may be varied by alteration in the inside diameter of the conductor, the orientation of the conduit relative to the flight path of the droplets entering the conduit, or by changing the velocity of the jet emitted by the drop generator. If desired, a group of generators may be employed so as to create mixtures of vapors with variable mixture ratio control.

In addition, it may not always be necessary that the droplets be propelled into a carrier gas. For example, the droplets may be metered into a vaporizer of the type having a hot plate. Upon striking the plate the droplets are vaporized and create pressure sufficient to cause a vapor stream to be emitted from the vaporizer.

It should be further understood that the specific embodiments just described merely illustrate principles of the invention in selected preferred forms. Many modifications, additions and deletions, other than those described, may be made thereto without departure from the spirit and scope of the invention as set forth in the following claims.

What is claimed is:

1. A method of generating a vapor stream comprising the steps of providing a jet of electrostatically chargeable particles; controlling the jet by electrostatic deflection so that some of the particles of the jet are directed into a vaporizer for a period of time sufficient to become vaporized while other particles of the jet are not directed into the vaporizer for a period of time sufficient to become vaporized; and emitting the vaporized particles from the vaporizer as a stream.

2. A method of generating a vapor stream in accordance with claim 1 wherein a carrier gas having a liquefaction temperature substantially lower than the boiling temperature of the liquid particles is passed through the vaporizer.

3. A method of generating a vapor stream in accordance with claim 1 wherein the liquid particles have a viscosity of less than 100 cps.

4. A method of generating a vapor stream comprising the steps of providing a carrier gas stream, providing a stream of electrostatically chargeable liquid particles, electrostatically controlling the liquid particles stream by selected deflection of liquid particles so that some of the particles are guided into the carrier gas stream, and maintaining said only some particles in the carrier gas stream for a period of time sufficient to become vaporized and entrained in the stream.

5. A method of generating a vapor stream in accordance with claim 4 wherein the carrier gas has a liquefaction temperature substantially lower than the boiling temperature of the liquid particles.

6. A method of generating a vapor stream in accordance with claims 4 or 5 wherein the liquid particles have a viscosity of less than 100 cps.

7. A method of generating a vapor stream in accordance with claim 4 wherein the liquid particles are selected from the group of liquids consisting of $SiCl_4$, $GeCl_4$, $POCl_3$ and $BBr_3$.

8. A method of generating a vapor stream in accordance with claims 4 or 7 wherein the carrier gas stream is comprised of a gas selected from the group of $O_2$, He and Ar.

9. A method of generating a vapor stream in accordance with claim 4 wherein the liquid particles are selected from the group of fuels consisting of ethyl alcohol, methyl alcohol and gasoline.

10. A method of generating a vapor stream in accordance with claims 4 or 9 wherein the carrier gas stream is comprised of $O_2$ and N.

11. A method of generating a vapor stream comprising the steps of providing a carrier gas stream, providing a stream of electrostatically chargeable liquid droplets vaporizable within the carrier gas stream within a period of time; and controlling the stream of droplets by electrostatic deflection so as to cause only some of the droplets in the stream of droplets to be within the carrier gas stream for said period of time and thereby become vaporized.

12. A method of generating a vapor stream comprising the steps of providing a carrier gas stream, providing a stream of electrostatically chargeable liquid droplets vaporizable within the carrier gas stream within a period of time; and controlling the stream of droplets by electrostatic deflection so as to guide some of the droplets in the stream of droplets into the carrier gas stream for said period of time and thereby become vaporized and so as to guide others of the droplets not into the carrier gas stream for the period of time and therefore not become vaporized.

13. Apparatus for generating a vapor stream comprising means for conveying a carrier gas stream including an opening; means for generating a jet of electrostatically chargeable liquid droplets; and means for electrostatically controlling the jet of liquid droplets so as to cause only a portion thereof to be introduced through said opening into the carrier gas stream for a period of time sufficient to become vaporized.

* * * * *

UNITED STATES PATENT AND TRADEMARK OFFICE
CERTIFICATE OF CORRECTION

PATENT NO. : 4,310,474
DATED : January 12, 1982
INVENTOR(S) : Rama Iyengar

It is certified that error appears in the above-identified patent and that said Letters Patent are hereby corrected as shown below:

Col. 1, line 31 change "of" second occurrence to read ---or---

Col. 2, line 12 change "inhomogenetities" to read ---inhomogeneities---

Col. 5, line 52 before "some" insert ---only---.

Signed and Sealed this

Sixth Day of April 1982

|SEAL|

Attest:

GERALD J. MOSSINGHOFF

Attesting Officer     Commissioner of Patents and Trademarks